(12) United States Patent
Habuka et al.

(10) Patent No.: US 6,194,691 B1
(45) Date of Patent: Feb. 27, 2001

(54) HEATING FURNACE AND MANUFACTURING METHOD THEREFOR

(75) Inventors: Hitoshi Habuka; Toru Otsuka, both of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/267,695

(22) Filed: Mar. 15, 1999

(30) Foreign Application Priority Data

Mar. 17, 1998 (JP) .................................................. 10-088057

(51) Int. Cl.[7] ................................ H05B 1/02; F21V 7/00; G01J 5/00
(52) U.S. Cl. .......................... 219/502; 392/419; 374/121; 374/124; 250/338.1
(58) Field of Search ...................................... 219/497, 502; 392/416, 418, 419, 420, 422, 411; 118/712, 725, 715, 50.1; 374/121, 124, 131, 132; 356/432, 445; 250/337, 338.1, 339.04, 339.06, 339.11, 340, 341.6, 341.7, 341.8

(56) References Cited

U.S. PATENT DOCUMENTS

| | | | |
|---|---|---|---|
| 4,854,263 | * 8/1989 | Chang et al. | 118/715 |
| 5,368,647 | * 11/1994 | Suzuki | 118/50.1 |
| 5,445,675 | * 8/1995 | Kubodera et al. | 118/725 |
| 5,650,082 | * 7/1997 | Anderson | 118/725 |
| 5,719,991 | * 2/1998 | Sandhu et al. | 392/416 |
| 6,005,231 | * 12/1999 | Lanovich et al. | 219/502 |

* cited by examiner

Primary Examiner—Sang Paik
(74) Attorney, Agent, or Firm—Snider & Associates; Ronald R. Snider

(57) ABSTRACT

This invention provides a method of manufacturing a wafer heating furnace having a desired heating distribution with less trials and errors by predicting heating distributions in the process of designing the heating furnace. In manufacturing a heating furnace for use of wafer heating having a light source and a lamp house surrounding the light source, on a presumption that a light flux emitted from the light source is mirror reflected by a wall surface of the lamp house while the light flux is mirror reflected also by a surface of a wafer, a path of the light flux attributable to the reflection on the wall surface of the lamp house as well as the reflection on the surface of the wafer is traced, a calculation of converting an absorption of the light flux occurring together with the reflection at least on the surface of the wafer into thermal energy is performed with respect to a plurality of light fluxes emitted from the light source to thereby arithmetically determine heating distributions on the wafer, and based on results of the calculation, a structure of the light source and the lamp house is determined.

4 Claims, 7 Drawing Sheets

F I G. 3
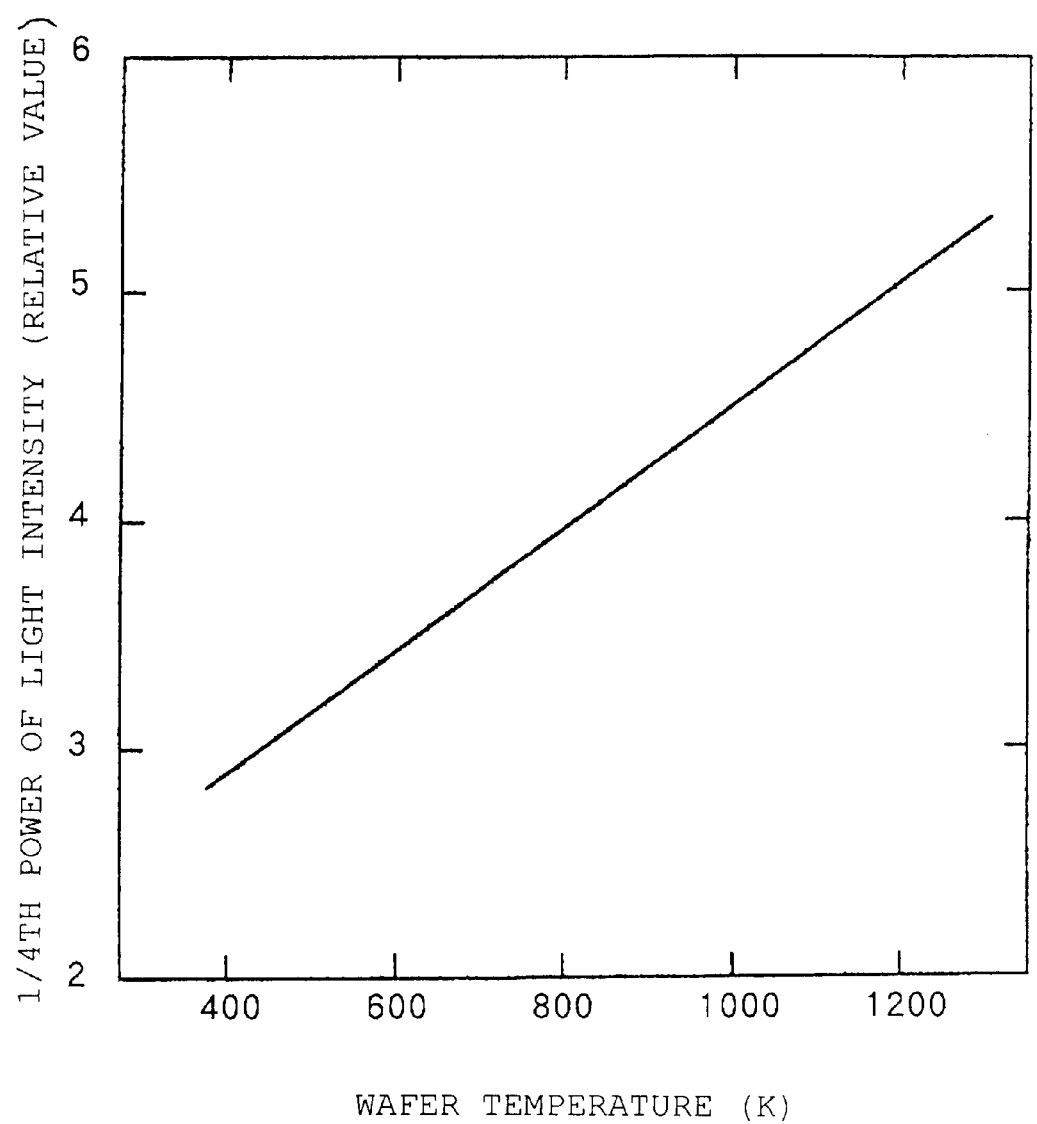

F I G. 4A
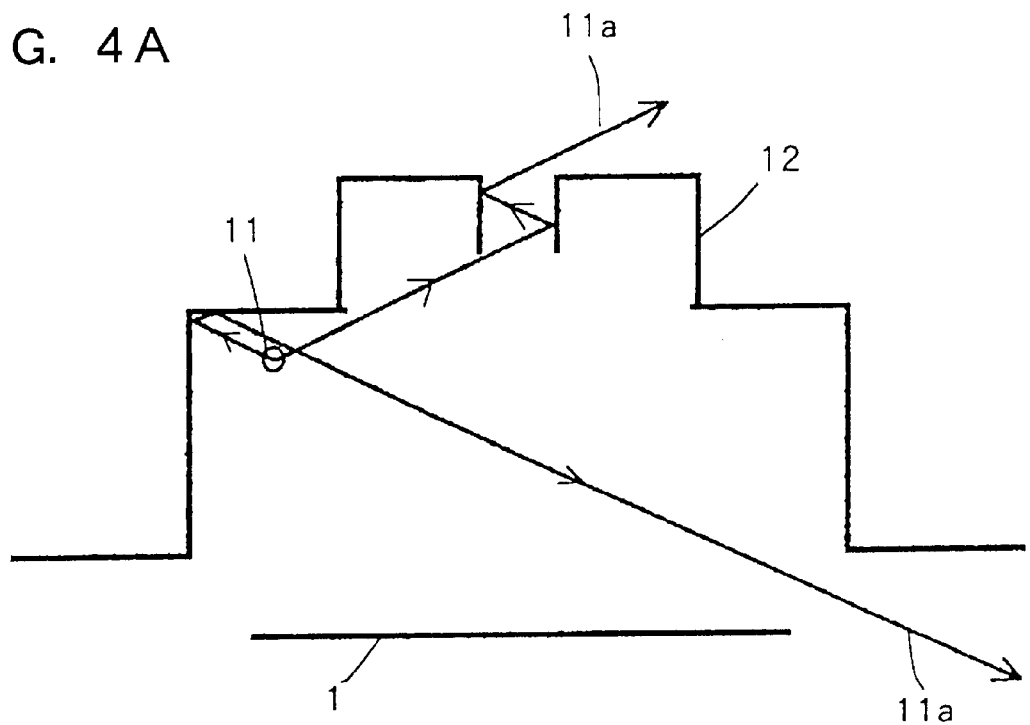
F I G. 4B
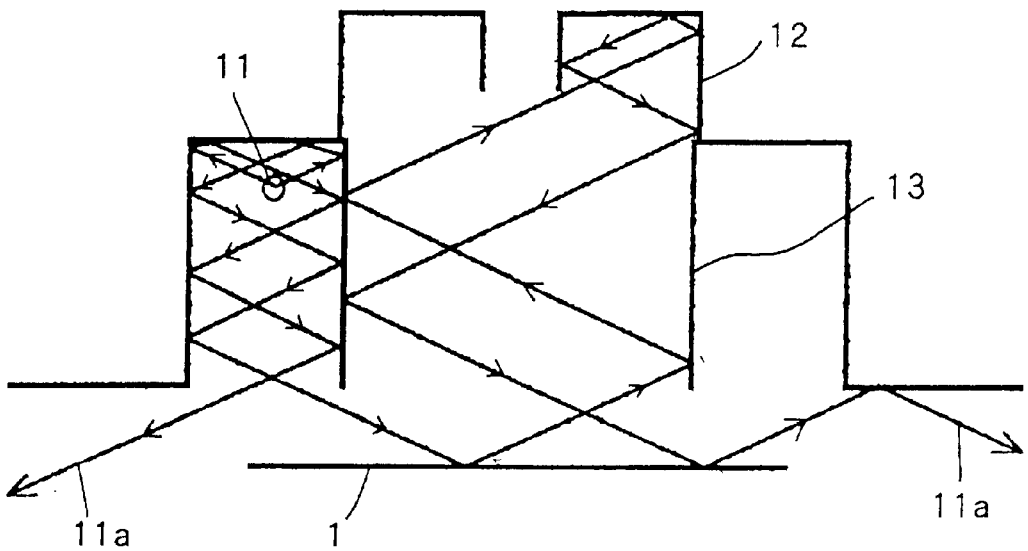

F I G. 7
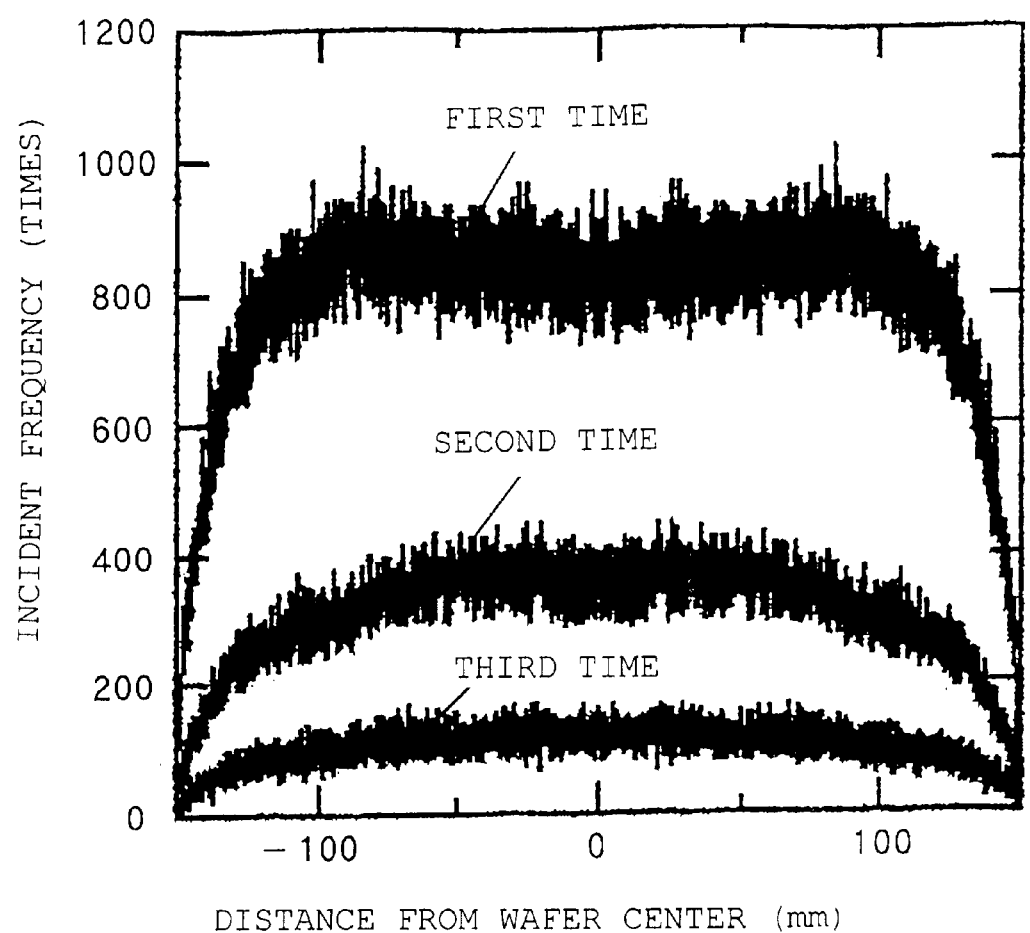

HEATING FURNACE AND MANUFACTURING METHOD THEREFOR

RELATED APPLICATION

This application claims the priority of Japanese Patent Application No. 10-88057 filed on Mar. 17, 1998, which is incorporated herein by reference.

BACKGROUND OF THE INVENTION

This invention relates to a method for manufacturing a heating furnace to be used when a thin film, such as silicon semiconductor single crystal thin films, is deposited on a surface of a wafer such as silicon semiconductor single crystal substrates.

For a deposition of a thin film such as a silicon semiconductor single crystal thin film on a surface of a wafer such as a silicon semiconductor single crystal substrate, there has been employed a so-called lamp heating furnace using radiant heating which is equipped with a light source for radiating light for use of heating, a lamp house having a wall surface that reflects light derived from the light source, and the like.

FIG. 1 shows an example of the arrangement of the heating furnace. This heating furnace comprises a reaction furnace 14 made of quartz glass 15 for holding a wafer 1 therein, and a lamp house 10 provided above the reaction furnace 14 and having a light source 11 such as a plurality of infrared lamps placed therein. The lamps of the light source 11 are arranged circumferentially in a plural number, and a mirror reflecting plate 12 for reflecting light emitted from the lamps of the light source 11 is mounted on the inside-wall surface of the lamp house 10. Besides, as required, a mirror reflecting cylinder 13 whose inner and outer surfaces depicted by broken line are mirror surfaces is also mounted. This mirror reflecting cylinder 13, which is removable, can be mounted for the control of heating distribution based on heating calculations.

Conventionally, design and manufacture of such a heating furnace has been carried out in a manner in which trials and errors are iterated through steps of, with respect to a trial-manufactured heating furnace prototype, first, measuring a heating temperature distribution of a wafer 1 in a heating experiment using thermocouples 2 as shown in FIG. 1, then making improvements on the heating furnace prototype based on results of the experiment, and further performing temperature measurement again in another heating experiment. In brief, the heating furnace has hitherto been designed and manufactured empirically. As a result, quite a large number of times of trials and errors have been involved before the completion.

This being the case, an attempt to reduce the number of times of trials and errors has also been made by performing temperature prediction with numerical calculation. This attempt is implemented by simulations based on the presumption that light emitted from the light source is all irregularly reflected.

However, since a mirror-surfaced reflecting plate has been used in recent years as the wall surface of the lamp house of the heating furnace for heating the wafer, such as a silicon semiconductor single crystal substrate, correct temperature predictions cannot be achieved without regarding the light reflection occurring at the wall surface of the lamp house as regular reflection, i.e., mirror reflection rather than irregular reflection. Besides, since the wafer to be heated is a mirror-surfaced wafer, the main surface of which has been mirror finished, there is a need for taking into consideration about the light reflection occurring at the wafer surface. Therefore, with such a simulation method as would be applied to a conventional heating furnace comprising radiant heating and an irregularly reflecting plate, it has been difficult to perform temperature prediction in the case where the mirror-surfaced wafer is heated by a heating furnace in which a mirror-surfaced reflecting plate is used as the mirror surface of the lamp house.

More specifically, in the heating process by the heating furnace of recent years' use, in which a mirror-surfaced wafer and a mirror reflecting plate are included as component members, light emitted from the light source imparts energy to the wafer while undergoing a great many number of times of reflections, thus making it difficult to predict the energy distribution on the wafer, unlike heating furnaces characterized principally by irregular reflection. Due to this, with simulations based on the assumption that all of light is irregularly reflected, insufficient prediction of temperature distribution or the like would result so that only a heating furnace low in the degree of completeness could be obtained. Thus, in order to solve such issues as low heating efficiency, excessive trials and errors would be involved inevitably. This would lead to losses of not only time and expense but also earth resources.

SUMMARY OF THE INVENTION

Under these circumstances, there has been a desire for development of a method for predicting heating distribution and then, base on results of this prediction, designing and manufacturing a heating furnace. The invention has been accomplished in view of these and other problems, with an object to provide a heating furnace and a manufacturing method which allows a heating furnace having a desired heating distribution with less trial and error by predicting heating distribution in advance before heating the wafer.

In order to achieve the above object, the invention provides a method of manufacturing a heating furnace for use of wafer heating which has a light source and a lamp house surrounding the light source, the method comprising: a calculating process for determining heating distributions on a wafer on a presumption that a light flux emitted from the light source is mirror reflected by a wall surface of the lamp house while the light flux is mirror reflected also by a surface of the wafer, tracing a path of the light flux attributable to the reflection on the wall surface of the lamp house as well as the reflection on the surface of the wafer, performing a calculation of converting an absorption of the light flux into thermal energy occurring together with the reflection at least on the surface of the wafer with respect to a plurality of light fluxes emitted from the light source and a structure determining process of the light source and the lamp house based on a result of the calculation.

Preferably, the structure is determined so as to make a difference between a first heating distribution by light fluxes incident that come for the first time on said wafer and a second heating distribution by light fluxes incident that come for the second and following times after the first-time reflection on the wafer surface.

Preferably, said light source is presumed to be a set of a plurality of point light sources, and results of the calculation performed for each of a plurality of light fluxes emitted from said individual point light sources at different angles are totaled for all the angles and all said point light sources.

The invention also provides a heating furnace which has a light source and a lamp house surrounding the light source for use of heating a wafer, characterized in a structure in which there is a difference between a first heating distribution attributable to light fluxes incident for the first time on the wafer, and a second heating distribution attributable to light fluxes incident on the second and following times after the first-time reflection on the wafer surface.

Preferably, the structure is such a structure that peripheral portions of the wafer are heated more intensely by the light fluxes incident for the first time on the wafer, while central portions of the wafer are heated more intensely by the light fluxes incident for the second time on the wafer.

The inventors of the invention, focusing on characteristics in heating with light, have developed a method for manufacturing a heating furnace based on results of a prediction about the heating distribution through a numerical calculation in which straight traveling property and reflecting property of light as shown in FIG. 2 are described plainly. In a case that a light flux $11a$ emitted from a light source $11$ toward a mirror-finished wafer $1$ is mirror reflected according to a reflectivity R (where 0<R<1) on the surface of the wafer $1$, it was presumed that a part of a light energy before reflection is imparted into the wafer $1$ at a rate of (1−R) when the mirror reflection occurs. That is, out of light energy Io possessed by the light flux $11a$, energy Iab that is absorbed into the wafer $1$ is (1−R)Io. It is noted that the light flux $11a$ refers to energy radiated from the light source $11$ per unit time.

In addition, although the wafer $1$ transmits infrared rays, which are often used for lamp heating furnaces, at low temperatures such as room temperature, yet the wafer $1$ becomes a gray body at high temperatures (e.g., 600° C. or above), and eliminates the need of taking the transmission into considerations during the heating.

Therefore, Iab in FIG. 2 is given to the wafer $1$. In the invention, like this, calculations based on only a simple principle are performed and energies of light given to individual places of the surface of the wafer $1$ are added up, by which heating distribution of the wafer $1$ is predicted. Further, based on results of the calculations, a heating furnace is designed and manufactured. As to the temperature verification of the wafer $1$ in the manufactured heating furnace, temperature measurement is carried out while a silicon semiconductor single crystal substrate $1$ with the thermocouple $2$ attached thereto as in the prior art is placed within the reaction furnace $14$, for example, as shown in FIG. 1.

Also, according to the invention, with respect to the heating distribution of the wafer surface, a detailed prediction can be achieved while complex configuration of the heating furnace can be used in the calculations as it is, so that the heating furnace can be completed faster, as compared with the case where trials and errors for prototype manufacture of the heating furnace and temperature measurement would be repeated. In particular, because essential points in terms of the arrangement of the light source and the reflecting plate within the heating furnace can be grasped, a guideline for design can be easily determined. As a result, points that need improving can be clearly grasped, and therefore the heating furnace can be manufactured with a greatly reduced number of times of trials and errors.

Further, because the prediction of complicated paths of light fluxes makes it possible to design the energy distribution to be changed between the first energy imparted to the wafer by the first-time reflection of the light flux from the light source taking place at the wafer surface and the second energy imparted to the wafer by the second-time and following reflections, there can be offered an effect that a heating furnace having a high energy efficiency can be manufactured.

In short, according to this invention, as described hereinabove, by predicting the heating distribution by tracing the paths of light fluxes attributable to mirror reflection, a heating furnace can be freely designed and manufactured with a desired temperature distribution with the number of times of trials and errors being minimized. Furthermore, because of complete grasp of heating distributions, a heating furnace which also involves fewer trials and errors in the adjustment of temperature distribution while using the heating furnace can be manufactured, so that a further advantage can be obtained, allowing the heating conditions to be freely changed.

BRIEF DESCRIPTION OF THE DRAWINGS

FIG. 3 is a graph showing a relationship between light intensity and heating temperature;

FIGS. 4A and 4B are each an explanatory view showing the path of a light flux emitted from the light source;

FIG. 7 is a graph showing incident frequencies on the wafer in a case of a mirror reflecting cylinder is used.

DESCRIPTION OF THE INVENTION AND PREFERRED EMBODIMENT THEREOF

A manufacturing method of the invention will now be described below in terms of firstly a design based on numerical calculations and then a heating energy distribution.

Figure 1:
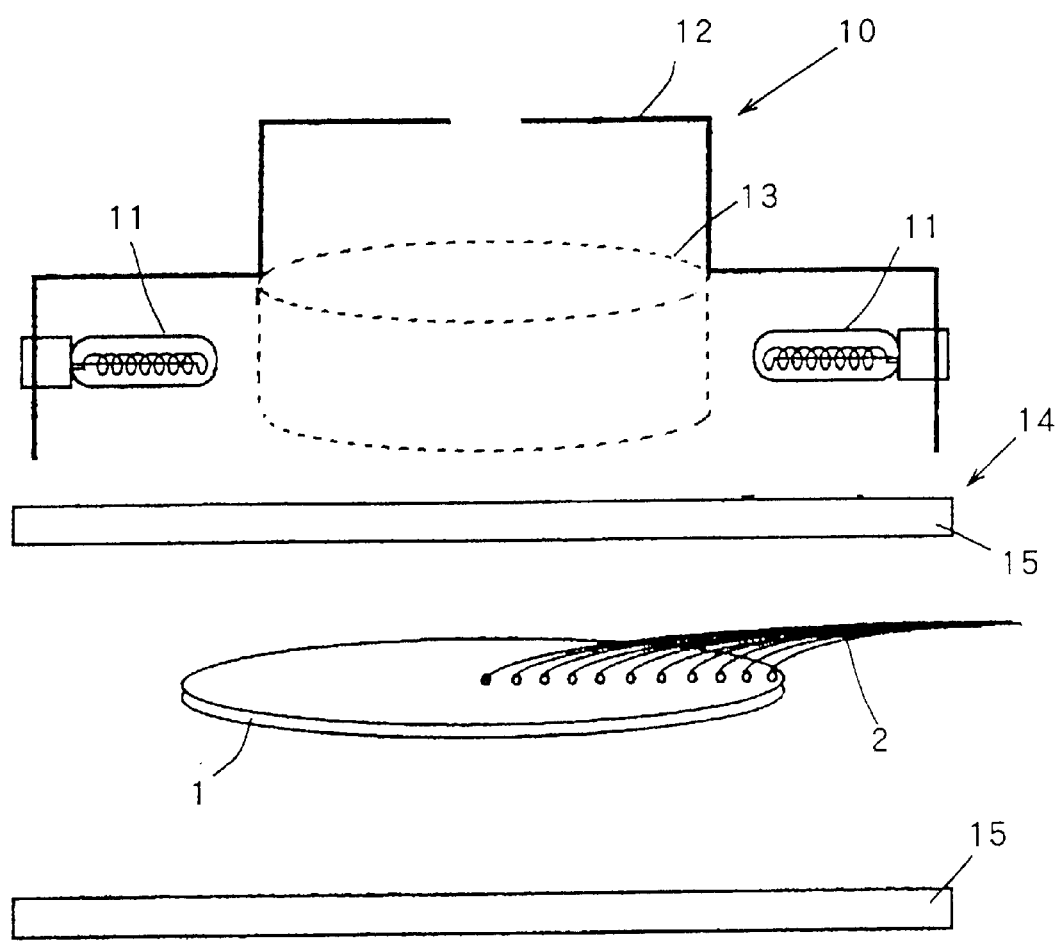
FIG. 1 is a schematic arrangement view showing an example of the heating furnace.
Figure 2:
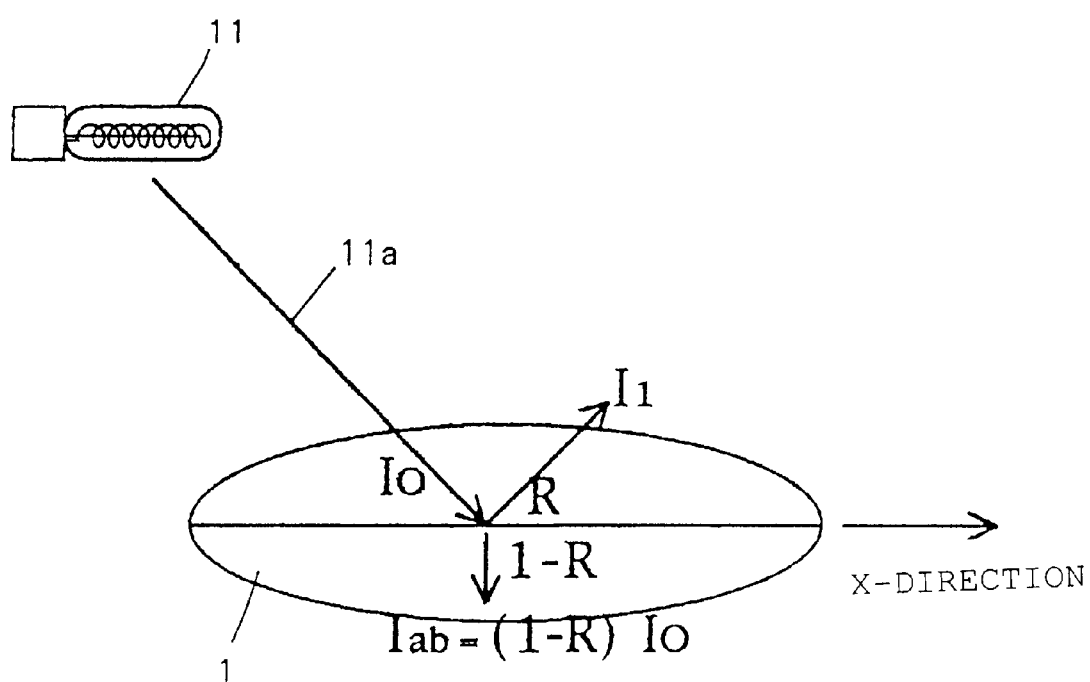
FIG. 2 is a view for explaining reflection and absorption of a light flux emitted from the light source on a wafer.

First, calculation values of energy given to the wafer $1$ and temperatures of actual measurement were compared with each other by analyzing the heating furnace of FIG. 1 with numerical calculations based on the principle shown in FIG. 2. Concretely, energy Iab that is absorbed to a wafer $1$ was calculated from the intensity of a light flux $11a$ emitted from a light source $11$, and compared with an actually measured temperature of the wafer $1$. Results of the comparison are shown in FIG. 3. In heat transfer by radiant energy, it is known as Stefan-Boltzmann's law that a linear relationship exists between the first power of temperature of a high-temperature substance and the ¼th power of radiant energy. This law was found holding also in the simulation technique developed in the present invention, by which it was established that the present invention is a simulation technique having generality.

FIGS. 4A and 4B show an example of simulation executed in the design of a heating furnace. This is a result of tracing in detail the path along which the light flux $11a$ emitted from the light source $11$ passes until going out of the heating furnace. It is shown in the figures that, in a case of a mirror reflecting cylinder $13$ is not used (FIG. 4A), light fluxes $11a$ emitted in obliquely upward two directions from the light source $11$ placed at one end of a lamp house $10$ are reflected two times by a mirror reflecting plate $12$ and thereafter reach to the opposite side of the heating furnace, and another case of the mirror reflecting cylinder $13$ is used (FIG. 4B), the light fluxes 11a are reflected twelve times between the mirror reflecting cylinder 13 and the mirror reflecting plate 12 located outside of the mirror reflecting cylinder 13, reach twice to the surface of the wafer 1 and thereafter go out to the opposite side of the heating furnace. It can therefore be understood that differences of the paths of the light fluxes 11a emitted from the light source 11 due to the presence or absence of the mirror reflecting cylinder 13 can concretely be predicted by the simulation technique developed by the invention.

Figure 5:
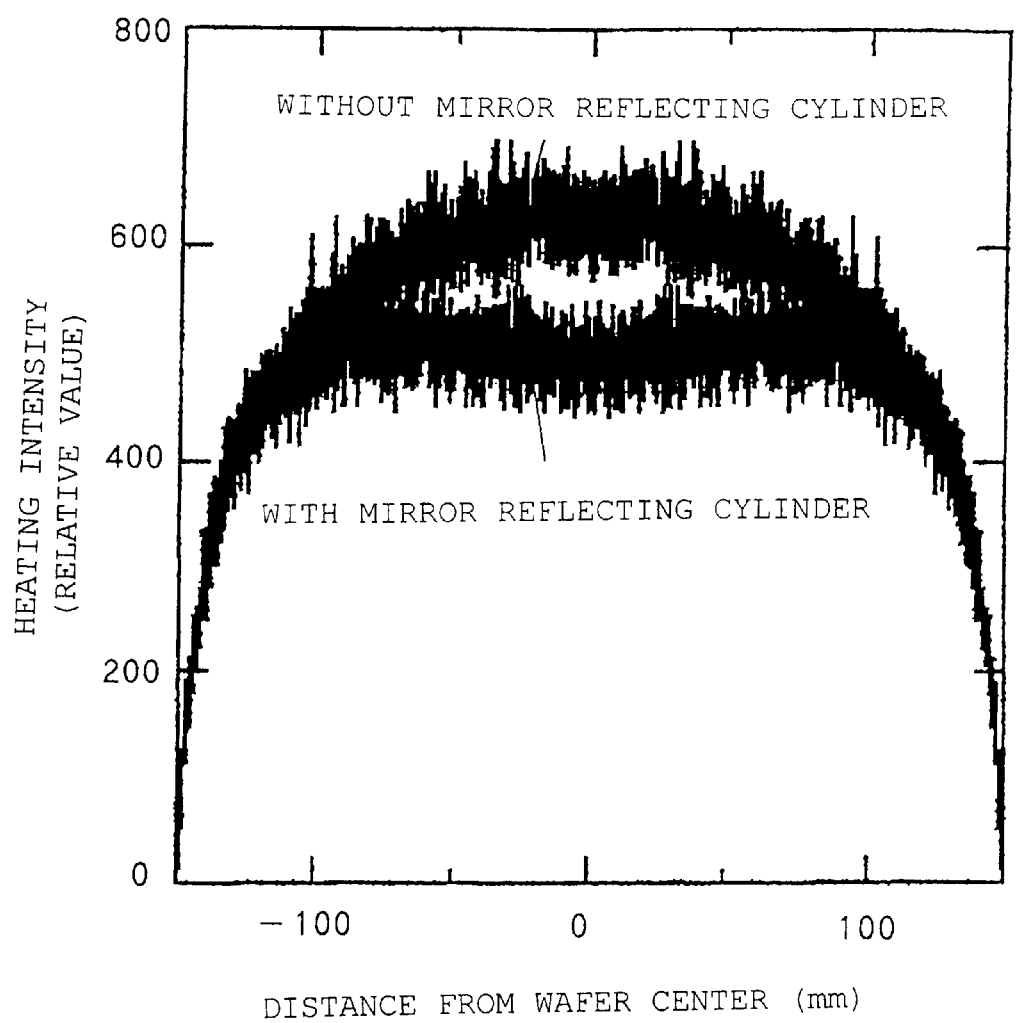
FIG. 5 is a graph showing heating energy distributions on the wafer.

FIG. 5 shows distributions of energy given to the wafer 1, which are calculated by the method of the invention, with respect to the heating furnace shown in FIG. 1. In this case, a heating furnace in which twenty infrared lamps 11 were arranged circumferentially was used. The concrete calculation method is shown below. First, one infrared lamp 11 is regarded as a set of four point light sources equidistantly arrayed on one axis. Next, with respect to one of the point light sources, for each of light fluxes 11a emitted in steps of 1° within a range of 180° on an imaginary plane including the axis and directed along the wafer 1, the path along which each of the light fluxes 11a is reflected on the surfaces of the mirror reflecting plate 12 and the wafer 1 is sequentially traced, and besides the absorption of the light flux 11a occurring at each reflection on the surface of the wafer 1 is calculated so as to be converted into thermal energy. This calculation is performed for the case where the plane including the axis is rotated 360° around the axis in steps of 1°, with respect to the aforementioned one of the point light sources. Further, these calculations are performed for all of the four point light sources, and furthermore, after performing these calculations for each of the twenty light sources 11, the results are totaled. In this way, a distribution of energy given to the wafer 1 is obtained. In addition, these calculations were based on the presumptions that the reflectivity R=1.0 (the rate of absorption=0) for reflections on the surface of the mirror reflecting plate 12, and that the reflectivity R=0.3 (rate of absorption=0.7) for reflections on the wafer 1.

According to FIG. 5, without the mirror reflecting cylinder 13, it is predicted that the wafer 1 is put into such a heating state that the heating intensity due to the absorption of the light flux 11a is high in central portions and low in peripheral portions. Meanwhile, with the mirror reflecting cylinder 13 being provided, it is predicted that because the absorption of energy in central portions of the wafer 1 is suppressed, a more uniform heating intensity over the entire wafer can be obtained although somewhat higher heating distributions result in peripheral portions.

Based on the above simulation results, a silicon semiconductor single crystal substrate 1 was heated up to 1000° C. and temperature distribution from central portions to peripheral portions of the silicon semiconductor single crystal substrate 1 was measured as shown in FIG. 1. As a result, without the mirror reflecting cylinder 13, the peripheral portions were about 100° C. lower than the central portions. With the mirror reflecting cylinder 13, on the other hand, an excellently uniform temperature distribution was able to be formed, where although the peripheral portions were slightly higher than the central portions, their temperature difference was within 3° C. This means that a uniform temperature distribution was able to be obtained with almost no trials and errors. Like this, by predicting the heating distribution with the method of the invention, a heating furnace having a desired heating distribution can be completed with a minimal number of times of trials and errors.

The next important point in the simulation method of the invention is that a heating furnace can be designed by predicting changes in the distribution state of energy given to the wafer with the counts of reflection times on the wafer surface.

Figure 6:
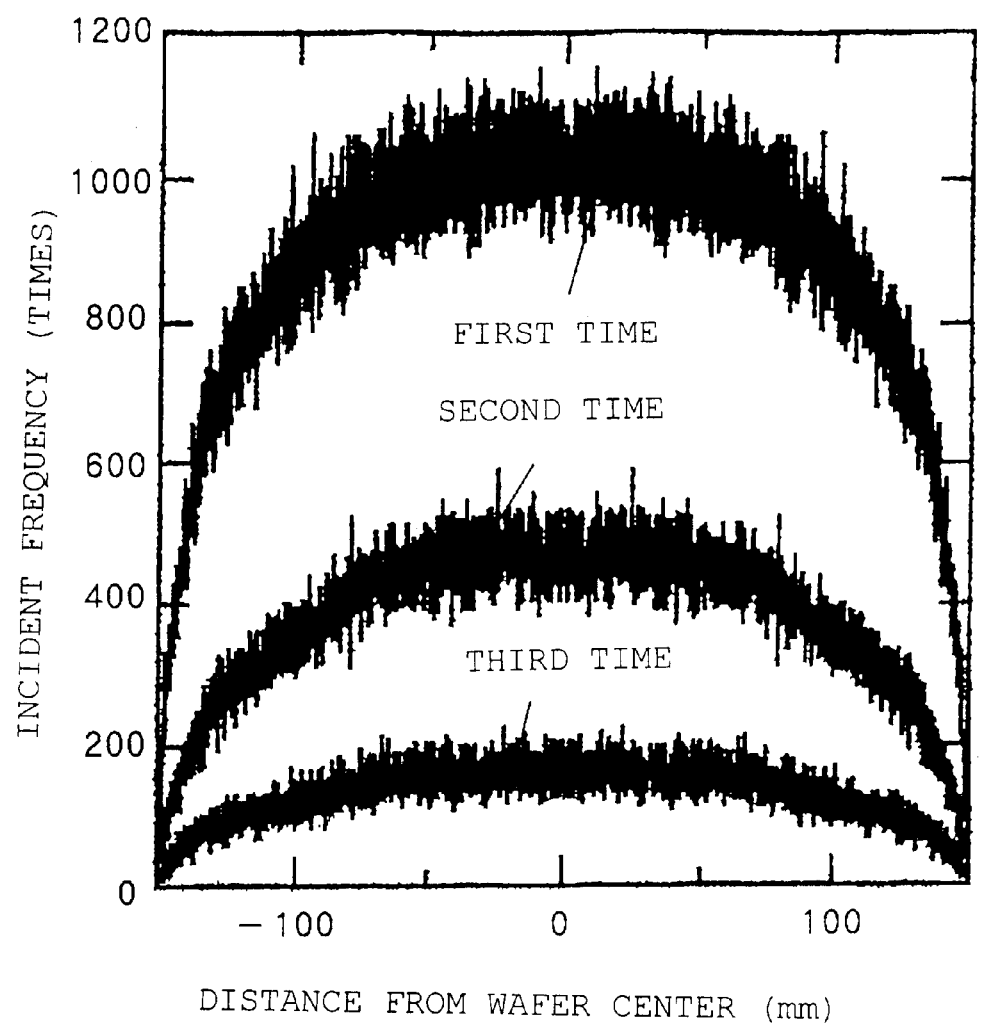
FIG. 6 is a graph showing incident frequencies on the wafer in a case of a mirror reflecting cylinder is not used.

FIG. 6 shows a result of calculations along the direction of the diameter of the wafer 1 to the number of times that light comes incident on the surface of the wafer 1 in the case without the mirror reflecting cylinder 13. The distribution of light fluxes (first-time reflection) that come incident on the wafer 1 from the light source 11 directly or for the first time after the reflection on the mirror reflecting plate 12 shows an incident frequency distribution in which the incident frequency is higher in central portions of the wafer 1 and lower in peripheral portions. This distribution state is unchanged also in the second- and third-time reflections.

Meanwhile, FIG. 7 shows a result of other calculations in the case with the mirror reflecting cylinder 13 being provided, in the heating furnace of FIG. 1. Whereas the first-time reflection shows a noticeably large number of times of incidence coming light fluxes on the peripheral portions, the second- and third-time reflections show higher numbers of times of incidence on the central portions, converse to the first-time reflection. In addition, counts of reflection times on the surface of the wafer 1 and energy intensity are in a proportional relation as can be understood from the explanation of FIG. 2. Besides, even after the first-time reflection, a light flux, normally, still has about 30% of the initial energy emitted from the light source, thus capable of producing a considerable effect. In the case of FIG. 7, the result of totaling the first-time reflection and the second-time and following reflections corresponds to the heating distribution of the wafer. Accordingly, it can be understood that the second-time and following reflections serve for a function of correcting the distribution of energy given to the wafer at the first-time reflection into a flatter heating distribution.

By predicting the heating distribution with the simulation technique developed by the present invention, it becomes possible to change the distribution of energy given to the wafer between the first-time reflection and the second-time and following reflections, thus making it feasible to effectively utilize the second-time and following reflections that have hitherto been ignored. This enables a heating furnace to be improved in energy efficiency, and therefore a heating furnace advantageous also in the protection of earth environment can be implemented.

It is needless to say that, as the wafer, compound semiconductor substrates or the like in addition to silicon semiconductor single crystal substrates are included in the scope of the invention. Further, the arrangement of the reflecting plate, the light source and the wafer herein described is only an example of the invention, and not limited to such structures.

What is claimed is:

1. A method of manufacturing a heating furnace for use of wafer heating which has a light source and a lamp house surrounding the light source, the method comprising: a calculating process for determining heating distributions on a wafer where a light flux emitted from the light source is mirror reflected by a wall surface of the lamp house while the light flux is mirror reflected also by a surface of the wafer, tracing a path of the light flux attributable to the reflection on the wall surface of the lamp house as well as the reflection on the surface of the wafer, performing a calculation of converting an absorption of the light flux into thermal energy occurring together with the reflection at least on the surface of the wafer with respect to a plurality of light fluxes emitted from the light source and a structure determining process of the light source and the lamp house based on a result of the calculation.

2. A method of manufacturing a heating furnace according to claim 1, wherein the structure determining process determines a structure based upon a difference between a first heating distribution by light fluxes incident that come for the first time on said wafer and a second heating distribution by light fluxes incident that come for the second and following times after the first-time reflection on the wafer surface.

3. A method of manufacturing a heating furnace according to claim 1, wherein said light source is calculated as a set of a plurality of point light sources, and results of the calculation performed for each of a plurality of light fluxes emitted from said individual point light sources at different angles are totaled for all the angles and all said point light sources.

4. A method of manufacturing a heating furnace according to claim 2, wherein said light source is calculated as a set of a plurality of point light sources, and results of the calculation performed for each of a plurality of light fluxes emitted from said individual point light sources at different angles are totaled for all the angles and all said point light sources.

* * * * *